(12) United States Patent
Jao et al.

(10) Patent No.: US 7,176,555 B1
(45) Date of Patent: Feb. 13, 2007

(54) FLIP CHIP PACKAGE WITH REDUCED THERMAL STRESS

(75) Inventors: Jui-Meng Jao, Miao-Li Hsien (TW); Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 8 days.

(21) Appl. No.: 11/161,171

(22) Filed: Jul. 26, 2005

(51) Int. Cl.
  *H01L 23/544* (2006.01)
(52) U.S. Cl. ............... 257/620; 257/618; 257/619; 257/778; 257/797; 438/462; 438/113
(58) Field of Classification Search ........ 257/E23.194, 257/618–620, 778, 797, 758, 734, 635, 632; 438/462, 113, 458
See application file for complete search history.

(56) References Cited

U.S. PATENT DOCUMENTS

| | | | | |
|---|---|---|---|---|
| 5,336,918 A | * | 8/1994 | Ipposhi et al. | 257/419 |
| 5,831,330 A | * | 11/1998 | Chang | 257/620 |
| 5,977,639 A | * | 11/1999 | Seshan et al. | 257/776 |
| 6,022,791 A | * | 2/2000 | Cook et al. | 438/458 |
| 6,204,557 B1 | * | 3/2001 | Lien et al. | 257/734 |
| 6,365,958 B1 | * | 4/2002 | Ibnabdeljalil et al. | 257/620 |
| 6,876,064 B2 | * | 4/2005 | Matumoto et al. | 257/632 |
| 2005/0263855 A1 | * | 12/2005 | Fu et al. | 257/620 |
| 2005/0280120 A1 | * | 12/2005 | Tomita | 257/620 |
| 2006/0012012 A1 | * | 1/2006 | Wang et al. | 257/620 |
| 2006/0163699 A1 | * | 7/2006 | Kumakawa et al. | 257/620 |

* cited by examiner

*Primary Examiner*—Kenneth Parker
*Assistant Examiner*—Chris C. Chu
(74) *Attorney, Agent, or Firm*—Winston Hsu

(57) ABSTRACT

A flip-chip package includes a packaging substrate; an integrated circuit die affixed to the packaging substrate, wherein the integrated circuit die includes an active integrated circuit surrounded by a peripheral die seal ring therein; and a thermal stress releasing pad disposed in a stress-releasing area that is at a corner of the integrated circuit die outside the die seal ring, wherein the thermal stress releasing pad is connected to the packaging substrate by using a solder bump, which, in turn, is connected to a dummy heat-spreading metal plate embedded in the packaging substrate so as to form a heat shunting path for reducing thermal stress during temperature cycling test.

11 Claims, 3 Drawing Sheets

FLIP CHIP PACKAGE WITH REDUCED THERMAL STRESS

BACKGROUND OF THE INVENTION

1. Field of the Invention

The present invention relates generally to the field of semiconductor packaging and, more particularly, to a flip-chip ball grid array (BGA) package with reduced thermal stress during thermal stress cycles.

2. Description of the Prior Art

High performance microelectronic devices often use solder balls or solder bumps for electrically and mechanically interconnection to other microelectronic devices. For instance, a very large scale integration (VLSI) chip may be connected to a circuit board or other next level packaging substrate by using solder balls or solder bumps. This connection technology is also referred to as "flip-chip" technology. Flip-chip technology uses area array connection and includes reflowing a body of solder onto a bonding pad to form a solder bump, so as to electrically connect an IC die to a packaging substrate. Electrical performance is effectively improved due to a shorter connection pass.

FIG. 1 is a schematic diagram of a prior art ball grid array (BGA) package. As shown in FIG. 1, BGA package 10 comprises a silicon chip 12 and a plastic substrate 18. The silicon chip 12 comprises a plurality of solder bump pads 14 respectively connecting to the corresponding solder bumps 16. The solder bump pads 14 connect to the plastic substrate 18 via the solder bumps 16. A gap between the silicon chip 12 and the plastic substrate 18 is filled with an underfill layer 20. The underfill layer 20 is used to provide better mechanical strength and adhesion during the stress cycles, however, the weak point is still in the chip's corners.

Drawbacks of the prior art package include interface delamination and corner bump cracking, which often occur at chip's corner during thermal stress test. It is believed that such delamination or cracking defects are caused by the mismatch in the coefficients of thermal expansion (CTE) of the integrated materials. Typically, the CTE of the silicon chip 12 is about 2.7 ppm/° C. and the CTE of the plastic substrate 18 is about 17 ppm/° C. Because the silicon chip 12 and the plastic substrate 18 have different coefficients of thermal expansion, a variation of ambient temperature deforms the package, and moreover, the products may fail. It has been known that the periphery region of the chip 12 is a highly thermal-stressed region.

To reduce the thermal stress, current practice includes adjustment of CTE and/or glass transformation temperature (Tg) of the underfill layer 20. However, a trade-off between the reduction of thermal stress and the protection of low-k dielectrics in the silicon chip 10 has to be taken into consideration. Further, the modification of the CTE or glass transformation temperature (Tg) of the underfill layer 20 is very complicated.

SUMMARY OF THE INVENTION

The primary objective of the present invention is to provide a flip-chip ball grid array (BGA) package with reduced thermal stress during thermal stress cycles or temperature cycling test.

According to the claimed invention, a flip-chip package is disclosed. The flip-chip package includes a packaging substrate; an integrated circuit die affixed to the packaging substrate, wherein the integrated circuit die includes an active integrated circuit surrounded by a peripheral die seal ring therein; and a thermal stress releasing pad disposed in a stress-releasing area that is at a corner of the integrated circuit die outside the die seal ring, wherein the thermal stress releasing pad is connected to the packaging substrate by using a solder bump, which, in turn, is connected to a dummy heat-spreading metal plate embedded in the packaging substrate so as to form a heat shunting path for reducing thermal stress during temperature cycling test.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is directed to on-chip heat shunting paths constructed at four vulnerable corners of an integrated circuit die for reducing thermal stress during temperature cycling test. Interface delamination occurs between low-k dielectric layers during thermal stress cycles. It has been observed that such interface delamination phenomenon is particularly severe at the four corners of a single die or chip.

Figure 1:
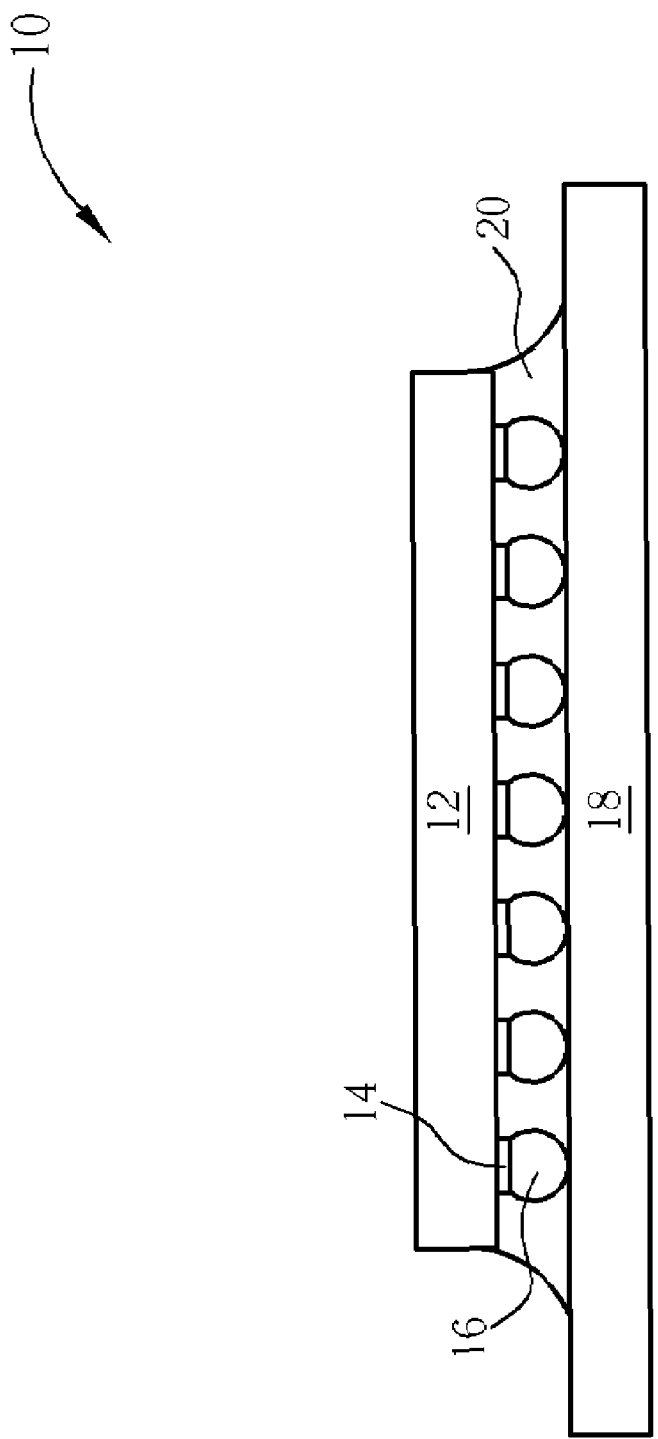
FIG. 1 is a schematic diagram of a prior art ball grid array (BGA) package according to the prior art.
Figure 2:
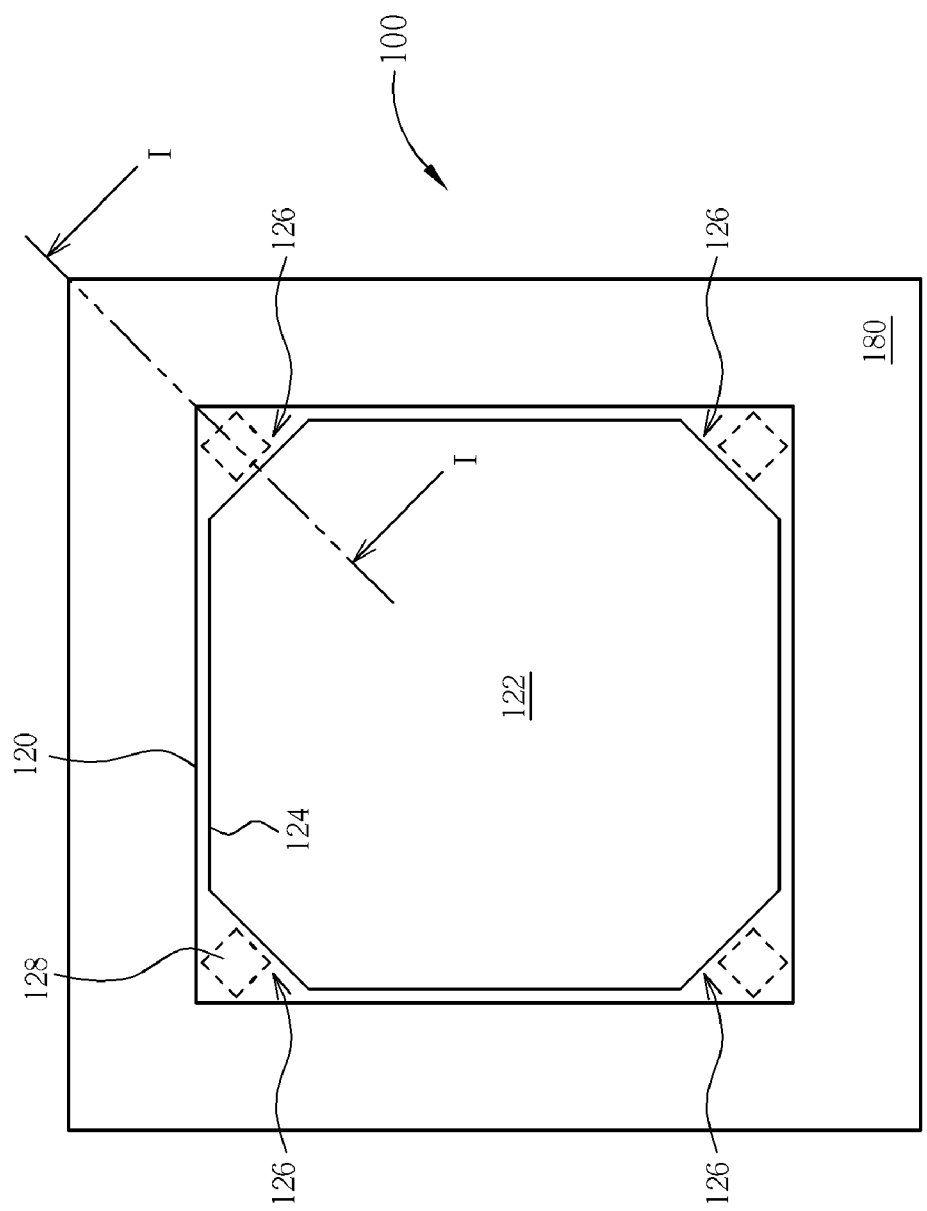
FIG. 2 is a perspective, plan view of a flip chip package according to one preferred embodiment of the invention.
Figure 3:
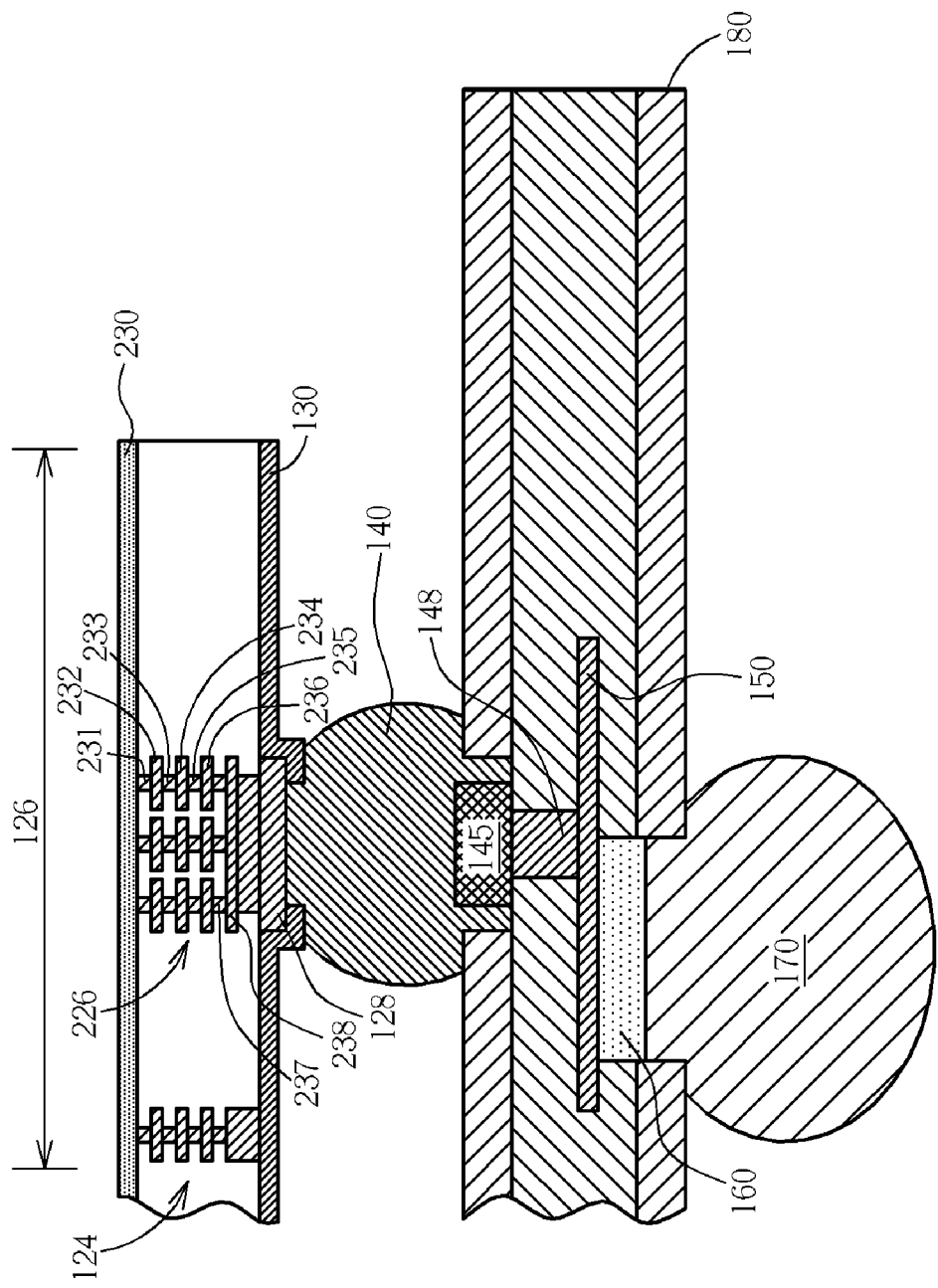
FIG. 3 is a schematic, cross-sectional view taken along line I—I of FIG. 2.

FIG. 2 and FIG. 3 show an exemplary flip chip package 100 according to the invention, wherein FIG. 2 is a perspective, plan view of a flip-chip package 100, and FIG. 3 is a schematic, cross-sectional view taken along line I—I of FIG. 2. As shown in FIG. 2 and FIG. 3, the flip-chip package 100 has an integrated circuit die 120 affixed to a packaging substrate 180. The integrated circuit die 120 includes an active integrated circuit 122 surrounded by a peripheral die seal ring 124.

The die seal ring 124 consists of a plurality of patterned metal layers, positioned on top of each other and mutually connected by via or contact plugs. The die seal ring 124 is common in the art and is utilized to protect the active integrated circuit 122 from being damaged by cracks originating from the wafer dicing process. The die seal ring 124 may be single seal barrier wall or dual-wall barriers formed in layers of similar or dissimilar dielectric materials.

The die seal ring 124 is manufactured step by step as sequential depositions of insulators and metals in conjunction together with the fabrication of the elements of the active integrated circuit 122. Typically, a heavily doped region (not shown) is diffused into semiconductor material such as a silicon substrate in a process needed otherwise for fabricating strongly doped surface regions in some circuit elements. This heavily doped region serves as an anchor for the die seal ring to be built, and permits the application of specific electrical potentials to the die seal ring, such as ground potential.

The fabrication of the die seal ring 124 is known in the art, and details of this will be skipped over in the following text.

The active integrated circuit 122 may comprise components such as, for example, transistors, diffusions, memory arrays and levels of interconnections. The integrated circuit die 120 includes four triangular stress-releasing areas 126 at its four corners that are outside the die seal ring 124. In each stress-releasing area 126, a bump pad 128 indicated by dash line is provided. The bump pads 128 are fabricated simultaneously with the bump pads or bonding pads of the active integrated circuit 122.

As shown in FIG. 3, each bump pad 128 in the stress-releasing area 126 is partially covered by a passivation coating 130. The underfill layer between the integrated circuit die 120 and the packaging substrate 180 is not shown. The exposed bump pad 128 is connected to the packaging substrate 180 by using a solder bump 140, which, in turn, is connected to a dummy heat-spreading metal plate 150 having a larger surface area than that of the bump pad 128 through a bump pad 145 and a via plug 148. Preferably, the surface are of the dummy heat-spreading metal plate 150 is at least 50 times as large as that of the bump pad 128.

The heat-spreading metal plate 150 is further connected to a bump pad 160 at the face opposite to the solder bump 140 and to the integrated circuit die 120. A solder ball 170 is provided on the bump pad 160 for the connection with a printed circuit board (not shown). It is noted that the packaging substrate 180, which may be made of glass, epoxy or the like, may have a plurality of levels, with electrical paths between layers provided by interconnect vias.

A heat-dissipating metal stack 226, which is fabricated simultaneously with the interconnections of the active integrated circuit 122, is connected to each bump pad 128 in the stress-releasing area 126. The heat-dissipating metal stack 226 is formed step by step as sequential depositions of insulators and metals in conjunction together with the fabrication of the interconnections of the active integrated circuit 122. As shown in FIG. 3, for example, the heat-dissipating metal stack 226 may comprises a contact plug 231 that is formed on a substrate 230, a first metal layer 232, a first via plug 233, a second metal layer 234, a second via plug 235, a third metal layer 236, a third via plug 237, and a fourth metal layer 238 that is directly connected to the bump pad 128.

The heat-dissipating metal stack 226, the bump pad 128, the solder bump 140, the heat-spreading metal plate 150, the bump pad 160, and the solder ball 170 constitute a heat shunting path that is able to quickly dissipate heat accumulated at the corners of the integrated circuit die 120 during temperature cycling test to a printed circuit board, thereby reducing thermal stress thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip-chip package, comprising:
   a packaging substrate;
   an integrated circuit die affixed to the packaging substrate, wherein the integrated circuit die includes an active integrated circuit surrounded by a peripheral die seal ring therein; and
   a thermal stress releasing pad disposed in a stress-releasing area that is at a corner of the integrated circuit die outside the die seal ring, wherein the thermal stress releasing pad is connected to the packaging substrate by using a solder bump, which, in turn, is connected to a dummy heat-spreading metal plate embedded in the packaging substrate so as to form a heat shunting path for reducing thermal stress during temperature cycling test.

2. The flip-chip package according to claim 1 wherein a heat-dissipating metal stack is provided underneath the thermal stress releasing pad.

3. The flip-chip package according to claim 2 wherein the heat-dissipating metal stack is fabricated simultaneously with interconnections of the active integrated circuit of the integrated circuit die.

4. The flip-chip package according to claim 2 wherein the heat-dissipating metal stack connects the thermal stress releasing pad with a semiconductor substrate of the integrated circuit die.

5. The flip-chip package according to claim 1 wherein the dummy heat-spreading metal plate has a surface are that is at least 50 times as large as that of the thermal stress releasing pad.

6. The flip-chip package according to claim 1 wherein the thermal stress releasing pad is connected to a first solder pad via the solder bump.

7. The flip-chip package according to claim 1 wherein the dummy heat-spreading metal plate is connected to a second solder pad that is used to connect with a printed circuit board.

8. A flip-chip package, comprising:
   a packaging substrate;
   an integrated circuit die affixed to the packaging substrate, wherein the integrated circuit die includes an active integrated circuit surrounded by a peripheral die seal ring therein; and
   a thermal stress releasing pad disposed in a stress-releasing area that is at a corner of the integrated circuit die outside the die seal ring, wherein the thermal stress releasing pad is connected to the packaging substrate via a solder bump.

9. The flip-chip package according to claim 8 wherein the thermal stress releasing pad is connected to a dummy heat-spreading metal plate embedded in the packaging substrate.

10. The flip-chip package according to claim 9 wherein the dummy heat-spreading metal plate has a surface are that is at least 50 times as large as that of the thermal stress releasing pad.

11. The flip-chip package according to claim 8 wherein a heat-dissipating metal stack is provided underneath the thermal stress releasing pad, and wherein the heat-dissipating metal stack connects the thermal stress releasing pad with a semiconductor substrate of the integrated circuit die.

* * * * *